US010862483B2

(12) United States Patent
Paganini et al.

(10) Patent No.: US 10,862,483 B2
(45) Date of Patent: Dec. 8, 2020

(54) LOW POWER CYCLE TO CYCLE BIT TRANSFER IN GATE DRIVERS

(71) Applicant: Infineon Technologies Austria AG, Villach (AT)

(72) Inventors: Amedeo Paganini, Milan (IT); Massimo Grasso, Trivolzio (IT); Sergio Morini, Pavia (IT); Davide Respigo, Pavia (IT)

(73) Assignee: Infineon Technologies Austria AG

( * ) Notice: Subject to any disclaimer, the term of this patent is extended or adjusted under 35 U.S.C. 154(b) by 0 days.

(21) Appl. No.: 16/257,871

(22) Filed: Jan. 25, 2019

(65) Prior Publication Data
US 2020/0244265 A1 Jul. 30, 2020

(51) Int. Cl.
*H03K 19/00* (2006.01)
*H03K 19/003* (2006.01)
*H03K 19/0185* (2006.01)

(52) U.S. Cl.
CPC ... *H03K 19/0013* (2013.01); *H03K 19/00315* (2013.01); *H03K 19/00369* (2013.01); *H03K 19/018521* (2013.01)

(58) Field of Classification Search
None
See application file for complete search history.

(56) References Cited

U.S. PATENT DOCUMENTS

| 4,410,815 A | * | 10/1983 | Ransom | H03K 19/09436 326/30 |
| 4,616,189 A | * | 10/1986 | Pengue, Jr. | H03F 3/45376 330/253 |
| 5,304,856 A | * | 4/1994 | Rainal | H03K 19/00353 327/108 |
| 6,292,342 B1 | * | 9/2001 | Miyamoto | G01R 1/36 324/762.01 |
| 6,985,007 B2 | * | 1/2006 | Yamauchi | H01P 5/02 326/30 |
| 2017/0179849 A1 | * | 6/2017 | Yokoi | H03K 17/0828 |

\* cited by examiner

*Primary Examiner* — Amy Cohen Johnson
*Assistant Examiner* — James H Cho
(74) *Attorney, Agent, or Firm* — Design IP

(57) ABSTRACT

A gate driver includes a high-side region that operates in a first voltage domain, a low-side region that operations in a second voltage domain lower than the first voltage domain, a termination region interposed between the high-side region and the low-side region and configured to isolate the first voltage domain from the second voltage domain, a high-side gate driver disposed in the high-side region and configured to drive a high-side power transistor, a low-side gate driver disposed in the low-side region and configured to drive a low-side power transistor, and a plurality of termination diodes disposed in the termination region and configured to transmit information bits between the high-side region and the low-side region, where each of the plurality of termination diodes includes an anode coupled to the low-side region and a cathode coupled to the high-side region.

22 Claims, 8 Drawing Sheets

| A | B | X O R | S | S E T | R E S E T | B i t h o x |
|---|---|---|---|---|---|---|
| 0 | 0 | 0 | 0 | 0 | 0 | * |
| 0 | 1 | 1 | 0 | 0 | 0 | * |
| 1 | 0 | 1 | 0 | 0 | 0 | * |
| 1 | 1 | 0 | 0 | 0 | 0 | * |
| 0 | 0 | 0 | 1 | 0 | 0 | * |
| 0 | 1 | 1 | 1 | 0 | 1 | 0 |
| 1 | 0 | 1 | 1 | 1 | 0 | 1 |
| 1 | 1 | 0 | 1 | 0 | 0 | * |

Write Successful

LOW POWER CYCLE TO CYCLE BIT TRANSFER IN GATE DRIVERS

FIELD

The present disclosure relates generally to bit transfers in gate drivers, and, more particularly, to low power cycle to cycle bit transfers in high voltage gate drivers and to methods for operating the same.

BACKGROUND

In monolithic high voltage (HV) gate drivers, a gate driver may include a low voltage (LV) gate driver used to drive a low-side transistor switch and an HV gate driver used to drive a high-side transistor switch. In such a configuration, it may be useful to transmit asynchronous digital data between the LV and HV gate drivers. Level shifter transistors can perform such a transmission but require a wide silicon area and are power consuming.

Therefore, an improved system capable of transmitting data between the LV and HV gate drivers that requires less silicon area and has lower power dissipation may be desirable.

SUMMARY

Embodiments provide a gate driver that includes a high-side region that operates in a first voltage domain, a low-side region that operations in a second voltage domain lower than the first voltage domain, a termination region interposed between the high-side region and the low-side region and configured to isolate the first voltage domain from the second voltage domain, a high-side gate driver disposed in the high-side region and configured to drive a high-side power transistor, a low-side gate driver disposed in the low-side region and configured to drive a low-side power transistor, and a plurality of termination diodes disposed in the termination region and configured to transmit information bits between the high-side region and the low-side region, where each of the plurality of termination diodes includes an anode coupled to the low-side region and a cathode coupled to the high-side region.

Embodiments further provide a method of transmitting information bits across a termination region between a high-side region and a low-side region of a gate driver. The method includes operating the high-side region in a first voltage domain, operating the low-side region in a second voltage domain lower than the first voltage domain, and transmitting the information bits between the high-side region and the low-side region through a plurality of termination diodes disposed in the termination region, where each of the plurality of termination diodes includes an anode coupled to the low-side region and a cathode coupled to the high-side region.

BRIEF DESCRIPTION OF THE DRAWINGS

Embodiments are described herein making reference to the appended drawings.

DETAILED DESCRIPTION

Figure 1A:
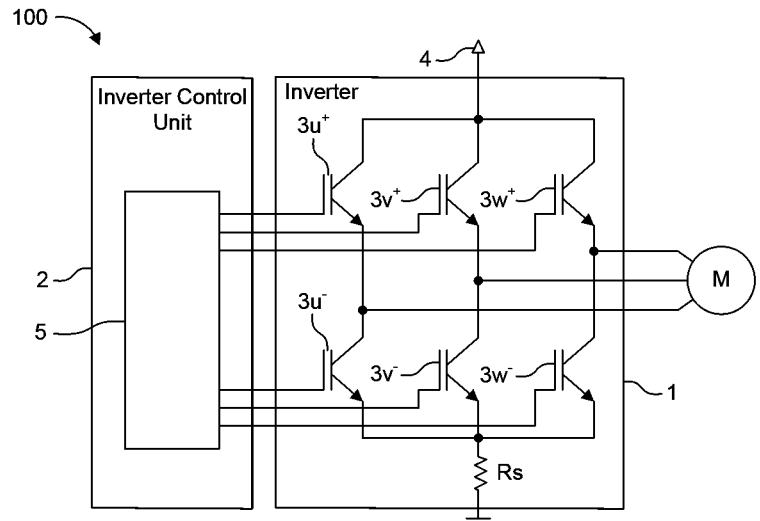
FIG. 1A is a schematic block diagram illustrating a motor control actuator of a power semiconductor device according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope defined by the claims. The following detailed description, therefore, is not to be taken in a limiting sense.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The term "substantially" may be used herein to account for small manufacturing tolerances (e.g., within 5%) that are deemed acceptable in the industry without departing from the aspects of the embodiments described herein.

A sensor may refer to a component which converts a physical quantity to be measured to an electric signal, for example, a current signal or a voltage signal. The physical quantity may, for example, be a current or a voltage at a shunt resistor in a single-shunt resistor system.

A signal processing circuit and/or a signal conditioning circuit may receive one or more signals from one or more components and perform signal conditioning or processing thereon. Signal conditioning, as used herein, refers to manipulating a signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Thus, a signal processing circuit may include an analog-to-digital converter (ADC) that converts the analog signal from the one or more sensor elements to a digital signal. The signal processing circuit may also include a digital signal processor (DSP) that performs some processing on the digital signal.

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor structure configured to conduct a load current along a load current path between two load terminal structures of the device. Further, the load current path may be controlled by means of a control electrode, sometimes referred to as gate electrode. For example, upon receiving a corresponding control signal from, e.g., a driver unit, the control electrode may set the power semiconductor device in one of a conducting state and a blocking state. A control signal may by a voltage signal or a current signal having a controlled value.

A power transistor is a power semiconductor device that may be used to drive a load current. For example, an IGBT is turned "ON" or "OFF" by activating and deactivating its gate terminal. Applying a positive input voltage signal across the gate and the emitter will keep the device in its "ON" state, while making the input gate signal zero or slightly negative will cause it to turn "OFF". There is a turn-on process and a turn-off process for switching the power transistor on and off. During the turn-on process, a gate driver integrated circuit (IC) may be used to provide (source) a gate current (i.e., an on current) to the gate of the power transistor in order to charge the gate to a sufficient voltage to turn on the device. In contrast, during the turn-off process, the gate driver IC is used to draw (sink) a gate current (i.e., an off current) from the gate of the power transistor in order to discharge the gate sufficiently to turn off the device. A current pulse may be output from the gate driver IC as the control signal according to a pulse width modulation (PWM) scheme. Thus, the control signal may be switched between an ON current level and an OFF current level during a PWM cycle for controlling a power transistor. This in turn charges and discharges the gate voltage to turn on and off the power transistor, respectively.

In particular, the gate of a power transistor is a capacitive load, and the turn ON current (i.e., gate source current) and the turn OFF current (i.e., gate sink current) are specified as the initial current when a switching event is initiated. During a turn OFF event, after some small amount of time (small compared to the PWM period), the gate current decreases and reaches a zero value when the gate reaches 0V. During a turn ON event, after some small amount of time (small compared to the PWM period), the gate current decreases and reaches a zero value when the gate reaches 15V. According to embodiments provided herein, the current values of the turn ON current and the turn OFF current can be programmed for both a HV gate driver and a LV gate driver. For example, an 3-bit configuration signal can be used to select the values of the turn ON current and the turn OFF current, which are selected from eight possible configurations under a 3-bit scheme. More or fewer configurations are possible by varying the number of bits used for the configuration signal.

Transistors may include Insulated Gate Bipolar Transistors (IGBTs) and Metal Oxide Semiconductor Field Effect Transistors (MOSFETs) (e.g., Si MOSFETs or SiC MOSFETs). While IGBTs may be used as an example in the embodiments below, it will be appreciated that MOSFETs may be substituted for the IGBTs and vice versa. In this context, when substituting a MOSFET for an IGBT, a MOSFET's drain may be substituted for an IGBT's collector, the MOSFET's source may be substituted for the IGBT's emitter, and the MOSFETs drain-source voltage Vis may be substituted for the IGBT's collector-emitter voltage $V_{CE}$ in any one of the examples described herein. Thus, any IGBT module may be substituted by a MOSFET module and vice versa.

Specific embodiments described in this specification pertain to, without being limited thereto, a power semiconductor device that may be used within a power converter or a power supply. Thus, in an embodiment, the power semiconductor device may be configured to carry a load current that is to be supplied to a load and/or, respectively, that is provided by a power source. For example, the semiconductor device may comprise one or more power semiconductor cells, such as a monolithically integrated diode cell, and/or a monolithically integrated transistor cell. Such diode cell and/or such transistor cells may be integrated in a power semiconductor module.

Power semiconductor devices that include transistors which are suitably connected to form half-bridges are commonly used in the field of power electronics. For example, half-bridges may be used for driving electric motors or switched mode power supplies.

For example, a multi-phase inverter is configured to provide multi-phase power by supplying multiple phase loads (e.g., a three-phase motor). For instance, three-phase power involves three symmetrical sine waves that are 120 electrical degrees out of phase with one another. In a symmetric three-phase power supply system, three conductors each carry an alternating current (AC) of the same frequency and voltage amplitude relative to a common reference but with a phase difference of one third the period. Due to the phase difference, the voltage on any conductor reaches its peak at one third of a cycle after one of the other conductors and one third of a cycle before the remaining conductor. This phase delay gives constant power transfer to a balanced linear load. It also makes it possible to produce a rotating magnetic field in an electric motor.

In a three-phase system feeding a balanced and linear load, the sum of the instantaneous currents of the three conductors is zero. In other words, the current in each conductor is equal in magnitude to the sum of the currents in the other two, but with the opposite sign. The return path for the current in any phase conductor is the other two phase conductors. The instantaneous currents result in a current space vector.

A three-phase inverter includes an three inverter legs, one for each of the three phases, and each inverter leg is connected to a direct current (DC) voltage source in parallel to each other. Each inverter leg includes a pair of transistors, for example, arranged in a half-bridge configuration for converting DC to AC. In other words, each inverter leg includes two complementary transistors (i.e., a high-side transistor and a low-side transistor) connected in series and which switch on and off complementary to the each other for driving a phase load. However, multi-phase inverters are not limited to three phases, and may include two phases or more than three phases, with an inverter leg for each phase.

FIG. 1A is a schematic block diagram illustrating a motor control actuator 100 of a power semiconductor device according to one or more embodiments. In particular, the motor control actuator 100 includes a power inverter 1 and an inverter control unit 2. The inverter control unit 2 behaves as a motor control unit and thus may also be referred to as a motor controller or a motor control IC. The motor control unit may be a monolithic IC or may be split into a microcontroller and a gate driver on two or more ICs.

The motor control actuator 100 is further coupled to a three-phase motor M, that includes three phases U, V, and W. The power inverter 1 is a three-phase current generator configured to provide three-phase power by supplying three phase currents to drive the motor M. It will be further appreciated that the power inverter 1 and the inverter control unit 2 may be placed on a same circuit board, or on separate circuit boards.

Deviations in both magnitude and phase may case a loss in power and torque in the motor M. Therefore, the motor control actuator 100 may be configured to monitor and control the magnitude and phase of the currents supplied to the motor M in real-time to ensure the proper current balance is maintained based on a feedback control loop. Open loop motor control units also exist and may be implemented.

The power inverter 1 includes a switching array of six transistor modules 3u+, 3u−, 3v+, 3v−, 3w+, and 3w− (collectively referred to as transistor modules 3) arranged in complementary pairs. Each complementary pair constitutes one inverter leg that supplies a phase current to the three-phase motor M. Thus, each inverter leg includes an upper (high-side) transistor module 3 and a lower (low-side) transistor module 3. Each transistor module may include one transistor, and may also include a diode (not shown). Thus, each inverter leg includes a upper transistor and a lower transistor. Load current paths U, V, and W extend from an output of each inverter leg (i.e., the output of each half-bridge) located between complementary transistors and are configured to be coupled to a load, such as motor M. The power inverter 1 is coupled to a DC power supply 4 (e.g., a battery or a diode bridge rectifier) and to the inverter control unit 2.

In this example, the inverter control unit 2 includes an motor control circuit and the gate driver circuit for controlling the switching array. In some examples, the inverter control unit 2 may be monolithic in which the motor control circuit and gate driver circuit are integrated onto a single die. In other examples, the motor control circuit and gate driver circuit may be partitioned as separate ICs. A "monolithic" gate driver is a gate driver on a single silicon chip and may be further made with specific HV technology. Furthermore, the gate driver IC may be integrated on the power inverter 1.

The motor controller IC performs the motor control function of the motor control actuator 100 in real-time. Motor control function can include either controlling a permanent magnet motor or an induction motor and can be configured as a sensorless control not requiring the rotor position sensing, as a sensor based control with Hall sensors and/or an encoder device, or as a combination of both sensor based control (e.g., used at lower rotor speeds) and sensorless control (e.g., used at higher rotor speeds).

For example, the inverter control unit 2 includes a controller and driver unit 5 that includes a microcontroller unit (MCU) as the motor controller IC and a gate driver IC for generating driver signals for controlling the transistors of each transistor module 3. Thus, load current paths U, V, and W may be controlled by the controller and driver unit 5 by means of controlling the control electrodes (i.e., gate electrodes) of the transistors 3. For example, upon receiving a control signal from the microcontroller, the gate driver IC may set a corresponding transistor in one of a conducting state (i.e., on-state) or a blocking state (i.e., off-state).

The gate driver IC may be configured to receive instructions, including the power transistor control signals, from the microcontroller, and turn on or turn off respective transistors 3 in accordance with the received instructions and control signals. For example, during the turn-on process of a respective transistor 3, the gate driver IC may be used to provide (source) a gate current to the gate of the respective transistor 3 in order to charge the gate. In contrast, during the turn-off process, the gate driver IC may be used to draw (sink) a gate current from the gate of the transistor 3 in order to discharge the gate.

The inverter control unit 2 or the controller and driver unit 5 itself may include a PWM controller, an ADC, a DSP, and/or a clock source (i.e., a timer or counter) used in implementing a PWM scheme for controlling the states of each transistor, and, ultimately, each phase current provided on the respective load current paths U, V, and W.

In particular, the microcontroller of the controller and driver unit 5 may use a motor control algorithm, such as a field-oriented control (FOC) algorithm, for providing current control in real-time for each phase current output to a multi-phase load, such a multi-phase motor. Motor speed may further be controlled by adding a speed control loop on top of FOC control. Thus, FOC may be considered as an inner control loop and a speed control loop may be considered as an outer control loop. In some cases, motor position may be controlled using a third control loop (e.g., a position control loop) outside of the speed control loop.

For example, during FOC, a motor phase current should be measured such that an exact rotor position can be determined in real-time. To implement the determination of the motor phase current, the MCU 5 may employ an algorithm (e.g., space vector modulation (SVM), also referred as space vector pulse width modulation (SVPWM)) that uses single-shunt current sensing.

Furthermore, the switches 3 (i.e., transistors) of the power inverter 1 are controlled so that at no time are both switches in the same inverter leg turned on or else the DC supply would be shorted. This requirement may be met by the complementary operation of the switches 3 within an inverter leg according to the motor control algorithm.

Figure 1B:
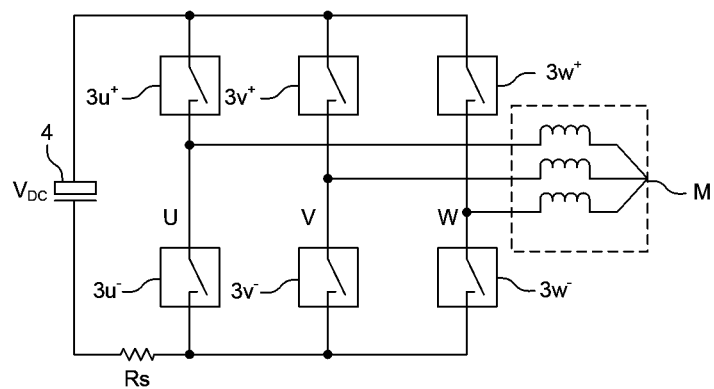
FIG. 1B is a schematic diagram illustrating a power inverter utilizing single-shunt current sensing according to one or more embodiments.

FIG. 1B is a schematic diagram illustrating a power inverter 1 utilizing single-shunt current sensing according to one or more embodiments. In particular, the power inverter 1 includes a shunt resistor Rs placed on the negative DC link of the power inverter 1. The transistors $3_{u+}$, $3_{u-}$, $3_{v+}$, $3_{v-}$, $3_{w+}$, and $3_{w-}$ are represented as switches and the motor M is shown with a winding for each of its phases. The MCU 5 in FIG. 1A may receive samples of the current taken from the shunt resistor Rs and then use an algorithm (i.e., software) to re-construct the three-phase current in real-time.

For example, SVPWM is a vector control based algorithm that requires the sensing of the three motor phase currents. By using the single-shunt resistor Rs, DC-link current pulses are sampled at exactly timed intervals. A voltage drop on the shunt resistor Rs may be amplified by an operational amplifier inside inverter control unit 2 and shifted up, for example, by 1.65V. The resultant voltage may be converted by an ADC inside inverter control unit 2. Based on the actual combination of switches, the three-phase currents of the motor M are reconstructed using the SVPWM algorithm. The ADC may measure the DC-link current during the active vectors of the PWM cycle. In each sector, two phase current measurements are available. The calculation of the third phase current value is possible because the three winding currents sum to zero.

SVPWM itself is an algorithm for the control of PWM in real-time. It is used for the creation of AC waveforms, and may be used to drive three-phase AC powered motors at varying speeds from a DC source using multiple switching transistors. While the examples herein are described in the context of three-phase motors, the examples are not limited thereto and may be applied to any load scheme.

In addition, it will be appreciated that other implementations other than a single-shunt resistor may be used for current sensing, as well as other motor control algorithms may be used to control the load, and that the embodiments described herein are not limited thereto.

Figure 2:
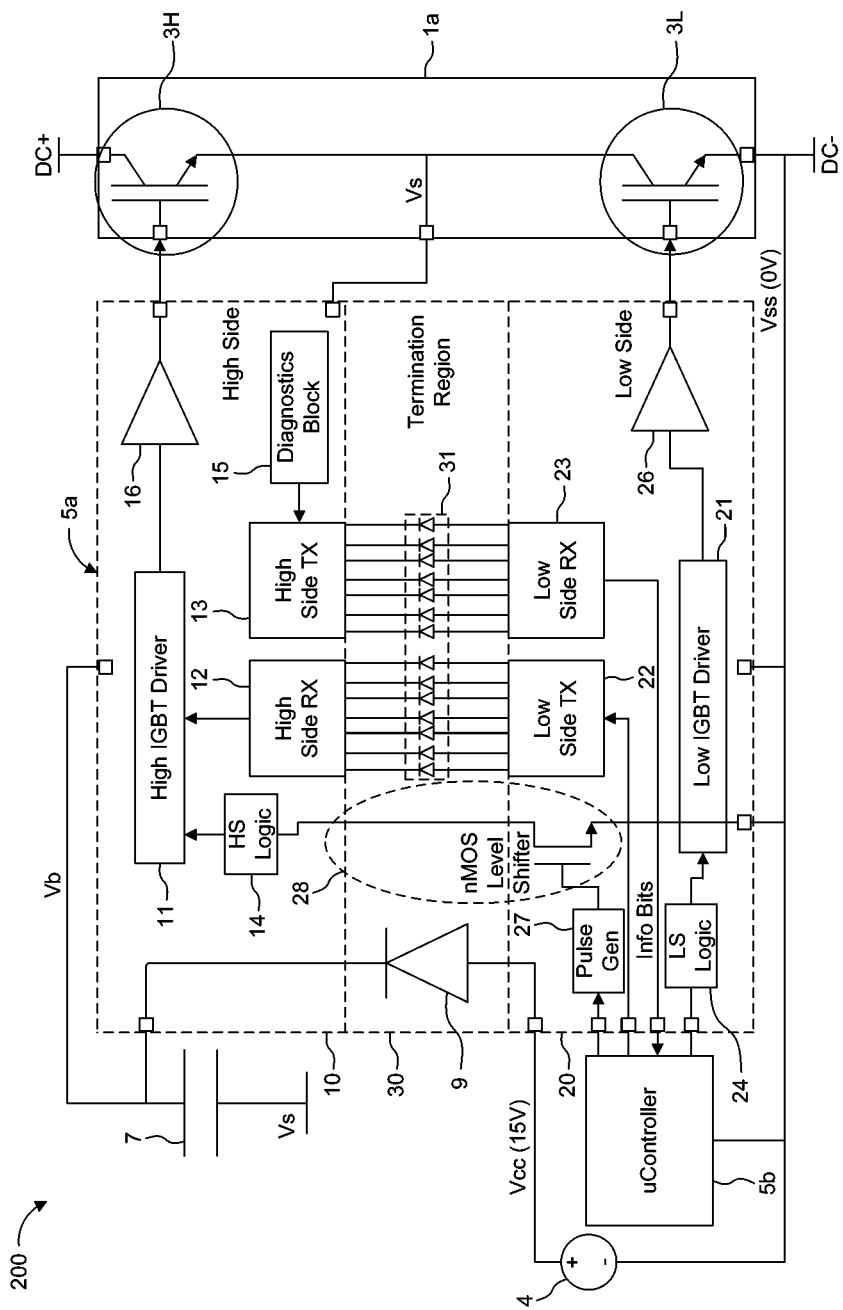
FIG. 2 is a schematic block diagram of an inverter control unit according to one or more embodiments.

FIG. 2 is a schematic block diagram of an inverter control unit 200 according to one or more embodiments. The inverter control unit 200 is configured to control the conducting states of power transistors provided in one or more inverter legs, with an example inverter leg 1a being shown. The power transistors of the inverter leg 1a include a high-side transistor 3H and a low-side transistor 3L, and correspond to a complementary pair of transistors. Thus, the high-side transistor 3H and the low-side transistor 3L may be representative of one of the complementary pairs of transistors shown in FIGS. 1A and 1B.

The inverter control unit 200 includes a gate driver 5a and microcontroller 5b, where the microcontroller 5b is electrically coupled to the gate driver 5a for the transmission of information and control signals therebetween, and the gate driver 5a is electrically coupled to the inverter leg 1a for the transmission of information and control signals therebetween.

Specifically, the gate driver 5a is a monolithic gate driver that includes three regions: a high-side region 10 that includes a HV gate driver 11, a low-side region 20 that includes a LV gate driver 21, and a termination region 30 that includes bit transfer diodes 31. The three regions 10, 20, and 30 are monolithically built in a single integrated circuit. The technology used to manufacture the gate driver 5a is capable of building all three regions on a single silicon die and build a single IC gate driver. In other words, the gate driver 5a is a single chip containing both a high side 10 and a low side 20. In between the high side 10 and the low side 20 is the termination region 30 whose main purpose is to electrically isolate the regions 10 and 20. Termination region 30 in this specific technology (and in other high voltage technologies) includes a large diode usually used as bootstrap diode 9 to charge bootstrap capacitor 7.

The inverter control unit 200 further includes a high-side supply voltage Vb (i.e., the supply of the high side region 10), a high-side ground voltage Vs (i.e., the ground of the high side region 10), a low-side supply voltage Vcc (i.e., the supply of the low side region 20), a low-side ground voltage Vss (i.e., the ground of the low side region 20), a bootstrap capacitor 7, and a bootstrap diode 9 located in the termination region 30. Typically, Vb is equal to Vs+Vcc, where Vcc is equal to 15V in this example (i.e., Vb−Vs=15V). That is, during normal operation Vb is 15V above Vs due to the bootstrap capacitor 7 supplying to the high side. DC+, positive power supply rail, is typically in the range of 200-1200V, but not limited thereto. On top of this, Vs is equal to DC− (e.g., Vss or 0V) when the low side switch 3L is on (and 3H off). DC− is a negative power supply rail and may be shorted to Vss, as shown, but need not be. In this case, Vb is near 15V and the bootstrap capacitor 7 is charging by Vcc through the bootstrap diode 9. Otherwise, Vs is equal to DC+ when the high side switch 3H is on (and 3L off), in this case Vb is 15V above DC+ and the bootstrap capacitor 7 is slowly discharging, being that the bootstrap diode 9 is off.

The aforementioned voltages are set such that the high-side region 10 operated in a higher voltage or power domain than that of the low-side region 20. For example, the low-side (external) supply voltage Vcc may be set to 15V and the high-side supply voltage Vb may be may be operated at a maximum voltage of 1215V when DC+ is 1200V. In addition, voltage Vdd refers to a nominal (drain) supply voltage, which is an internally generated and regulated voltage (e.g., 5.5V) Voltage Vdd may serve as the reference voltage for all logic gates.

The high-side region 10 includes the HV gate driver 11 that is configured to drive the power transistor 3H. In addition, the high-side region 10 includes a high-side receiver 12 configured to receive information bits in an uplink transmission direction from the low-side region 20, a high-side transmitter 13 configured to transmit information bits in a downlink transmission direction to the low-side region 20, high-side logic 14 configured to receive a control signal from the microcontroller 5b (e.g., via a pulse generator 27 and nMOS level shifter 28) and transmit the control signal to the HV gate driver 11, a diagnostics logic block 15 configured to sense anomalous events at the high region 10 (e.g., short circuit events, overcurrent events, high-side supply (Vb−Vs) overvoltage events, and high-side supply (Vb−Vs) undervoltage events) and generate an error flag in response thereto, and an output buffer 16. The output buffer 16 may serve to amplify the output of the HV gate driver 11 and provide the amplified signal as the control signal to the power transistor 3H.

The nMOS level shifter 28 is used to convert (i.e., level shift) the control signal, and thus transfer control information, from the low voltage/power domain to the high voltage/ power domain. The termination diodes 31 are used to transmit information bits between the two voltage domains. The level shifter is a "real-time" transmitter (i.e., a low delay compared to the PWM period). On the other hand, the termination diodes have a larger delay but consume less power and take up a smaller area.

The low-side region 20 includes the LV gate driver 21 that is configured to drive the power transistor 3L. In addition, the low-side region 20 includes a low-side transmitter 22 configured to transmit information bits in an uplink transmission direction to the high-side region 10, a low-side receiver 23 configured to receive information bits in a downlink transmission direction from the high-side region 10, low-side logic 14 configured to receive a control signal from the microcontroller 5b and transmit the control signal to the LV gate driver 21, an output buffer 26 configured to output a control signal to the power transistor 3L, the pulse generator 27, and the nMOS level shifter 28.

The microcontroller 5b is electrically coupled to the low-side region 20 of the gate driver 5a due to being in the same voltage domain (i.e., power domain) as the low-side region 20. The microcontroller 5b is configured to generate control signals for controlling the transistors 3L and 3H, and transmit the control signals to the gate driver 5a at the low-side region 20. For example, the gate driver 5a is configured to receive instructions from the microcontroller 5b to drive a motor phase (i.e., an inverter leg) connected to voltage Vs using PWM control signals. These PWM control signals are received by the gate driver 5a at the low-side region 20 and passed through to the corresponding HV gate driver 11 and the LV gate driver 21 via the appropriate logic (e.g., low-side logic 24 or the combination of the pulse generator 27, the nMOS level shifter 28, and the high-side logic 14). In order for the control signals to reach the HV gate driver 11, the control signals are transmitted through the termination region 30 from the low-side region 20. The HV gate driver 11 and the LV gate driver 21 are configured to receive the control signals and output the control signals to the corresponding power transistor 3L and 3H via an output terminal of the gate driver 5a.

The microcontroller 5b is further configured to transmit information bits to the high-side region 10 via the low-side region 20 and receive information bits from the high-side region 10 via the low-side region 20. Transmission towards the high-side region 10 of the gate driver 5a allows the microcontroller 5b to program one or more parameters of the HV gate driver 11, such as output current of the current pulse (control signal) and other synchronous rectification programming, making the HV gate driver 11 flexible and suitable for different application environments. Here, the high and low levels of the output current of a PWM current pulse may be configured according to the information received from the microcontroller 5b.

The microcontroller 5b is also configured to program one or more parameters of the LV gate driver 21, such as output current of the current pulse (control signal) and other synchronous rectification programming. Since the microcontroller 5b and the LV gate driver 21 are located in the same voltage domain, the configuration information bits can be sent to the LV gate driver 21 through the low-side logic 24.

In addition, the diagnostics block 15 in the high-side region 10 may be configured to senses anomalous events and raise flags when these occur. For example, the diagnostics block 15 may be configured to detect an overcurrent in the inverter leg 1a indicating a short circuit event, and generate an error flag in response to such a detection. The transmission to the low-side region 20 allows the diagnostics block 15 to transfer diagnostics information, including the error flags, to the microcontroller 5b. It is then possible for the microcontroller 5b to analyze the received diagnostics information and to take counteractions and restore safe operating conditions quickly. For example, the microcontroller 5b may adjust control signals sent to the HV and LV gate drivers based on the received diagnostics information.

The high-side 10 and the low-side region 20 are able to transfer information bits between the two regions via the bit transfer diodes 31 (i.e., termination diodes 31) that are located in the termination region 30. The low-side region 20 is located in low voltage domain in which the microcontroller 5b also resides, whereas the high-side region 10 is located in a high voltage domain. Thus, the gate driver 5a includes two different voltage domains. The termination region 30 isolates the high voltage domain from the low voltage domain, and may be referred to as an isolation termination region. Thus, the termination region 30 provides a high voltage isolation barrier in which the bit transfer diodes 31 are used to isolate the two voltage domains while enabling communication therebetween.

In this example, a multi-bit communication protocol is used to send information bits between the high-side region 10 and the low-side region 20. That is, there are multiple communication lines in the downlink direction (high-side to low-side), each having a termination diode 31, and there are multiple communication lines in the uplink direction (low-side to high-side), each having a termination diode 31. Because the termination diodes 31 are used to transmit information bits between the between the high-side region 10 and the low-side region 20, the may be referred to as transmission diodes. Each termination diode 31 has its anode coupled to the LV side region 20 (e.g., to either a low-side transmitter or receiver) and its cathode coupled to the HV side region 10 (e.g., to either a high-side transmitter or receiver). Some termination diodes 31 may be configured to transmit information bits from the high-side region 10 to the low-side region 20, and others may be configured to transmit information bits from the low-side region 20 to the high-side region 10. It will be appreciated that the number of bits transmitted is entirely configurable with one or more bits being transmitted in each direction.

Figure 3A:
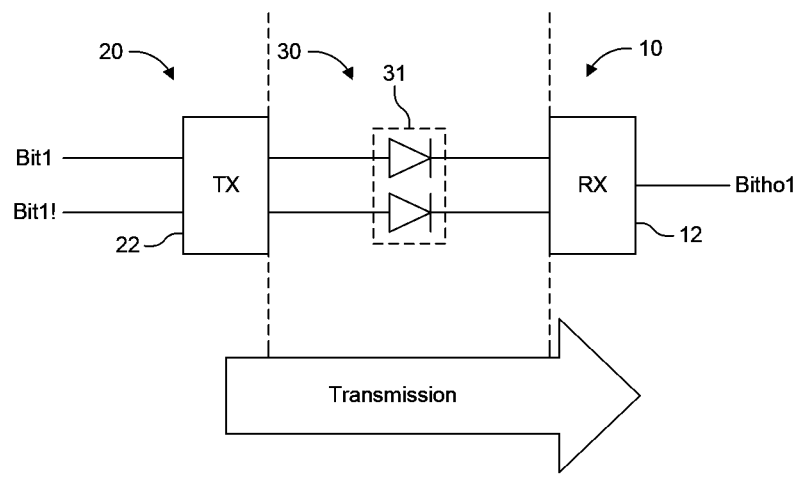
FIGS. 3A and 3B show schematic block diagrams of transmission interface circuits between high-side and low-side regions according to one or more embodiments.
Figure 3B:
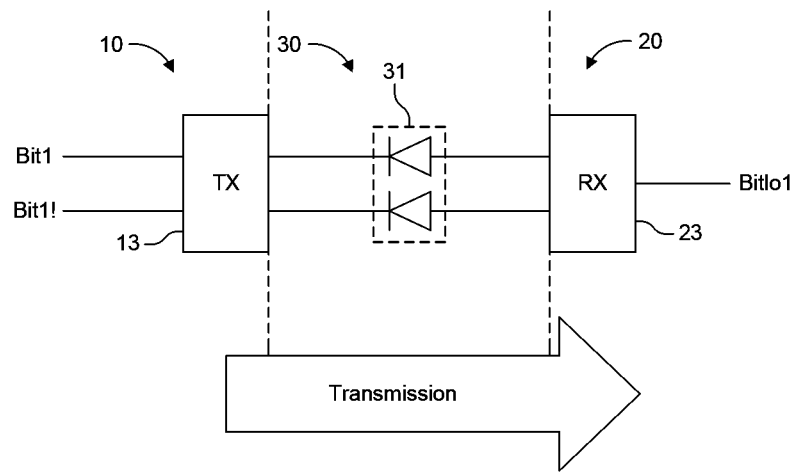

FIGS. 3A and 3B show a schematic block diagram of transmission interface circuits between high-side and low-side regions according to one or more embodiments. In particular, FIG. 3A illustrates an uplink transmission from the low-side transmitter 22 to the high-side receiver 12 via termination diodes 31 and FIG. 3B illustrates a downlink transmission from the high-side transmitter 13 to the low-side receiver 23 via termination diodes 31. A receiver node is defined herein as an input node to receiving paths on the receiver side (i.e., the node of the high-side receiver coupled to the cathode of a termination diode, and the node of the low-side receiver coupled to the anode of a termination node). Receiver nodes are identified as N1 and N2 throughout the figures.

If real-time transmission is not needed (e.g., if transmitting a few bits once during a PWM cycle is sufficient), a possible solution for transferring information bits to and from the high-side region 10 is to use the termination diodes 31 that are provided across the isolation termination region 30. The termination diodes 31 are smaller in width compared to the bootstrap diode 9. For example, the bootstrap diode 9 typically has a low resistivity in order to rapidly charge the bootstrap cap. Thus, the bootstrap diode 9 is nearly as wide (millimeters range) as the termination region 30 to achieve the lowest resistivity possible. Transmission diodes 31 instead should occupy the smallest area possible to leave most of the termination region for the bootstrap diode 9. Thus, the termination diodes 31 may be made with the smallest technology available (e.g., having a width of 12 um or less). For this reason, the termination diodes 31 may be referred to a minimum width diodes. Thus, the termination diodes 31 may have a minimum width defined by the smallest technology node of the technology in which the gate driver is implemented and are configured to transmit information bits when the floating HV well is low (i.e., when the lower power switch 3L is on). In one example, the termination diodes 31 may have a minimum width having a width of 12 um or less.

When the floating HV well is low (i.e., when the low-side power switch 3L is on), Vs is equal to or substantially equal to Vss (i.e., Vs=~Vss) and Vcc is equal to or substantially equal to Vb (i.e., Vcc=~Vb) a differential transmission is possible through the transmission interface circuits. In this situation, during the PWM cycle when the low-side power switch 3L is on, it can be said that the voltage domains are aligned. When the voltage domains are aligned, two minimum width termination diodes 31 can be forward biased and bits may propagate across the junction. An uplink or downlink transmission can only occur if the voltage domains are aligned, and any transmission is interrupted when the high-side power switch is on since in this case the termination diodes 31 are reverse biased.

Voltage Vs changes in synchronization with the pulse width modulation imposed by the microcontroller 5b. For example, when the power transistor 3H is turned on and the power transistor 3L is turned off, Vs is equal to or substantially equal to DC+, which is typically in the range of 200-1200V, but not limited thereto. During normal operation Vb is 15V above Vs. In addition, when the power transistor 3L is turned on and power transistor 3H is turned off, Vs is equal to or substantially equal to DC− (e.g., Vss or 0V). Thus, Vs alternates between DC+ and DC− according to the PWM command. The PWM imposed by the microcontroller 5b dictates the turn on/off cycle for each power transistor 3H and 3L. Consequently, the PWM also dictates the duty cycle of voltage Vs and when the voltage domains are aligned (i.e., when the power transistor 3L is on and Vs=~Vss). The inductive load connected to the Vs node of the inverter leg 1a is driven with the PWM voltage.

The region of operation of the termination diodes 31 depends on two voltages: the transmitter output level and the level of Vs. The former is controlled by the input bits that are intended to be transferred, while the latter is controlled by the high-side driver 11, which acts on the power switch 3H, which in turn is controlled (by means of the pulse generator 27 and the nMOS level shifter 28) by the microcontroller 5b to impose PWM on Vs.

As will be described, an error correction transmission protocol is introduced to discriminate true transmissions from false transmissions, where false transmissions occur across the termination diodes 31 during dV/dt (diode capacitor coupling) and negative Vs (~Vs or NegVs) events. A negative Vs event occurs when the high-side potential Vs goes heavily under ground. Thus, dV/dt and NegVs sensing circuits are so included.

Figures 4A, 4B:
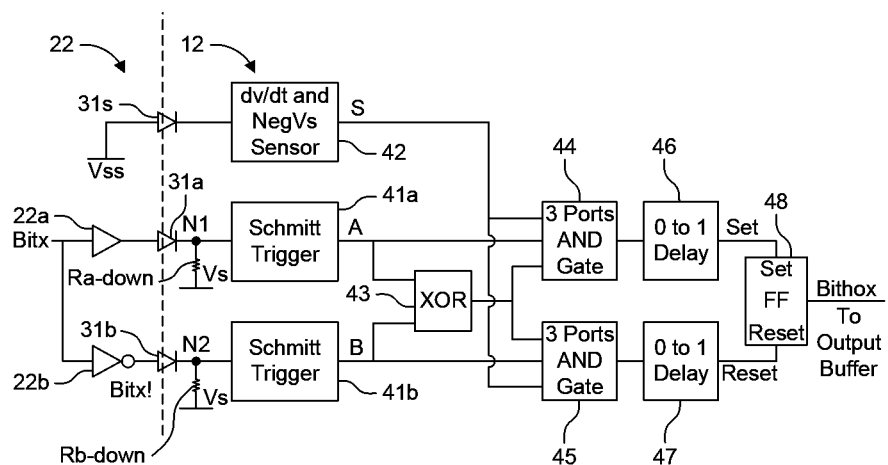
FIG. 4A shows a schematic block diagram of a high-side receiver circuit according to one or more embodiments.
FIG. 4B shows a truth table corresponding to the high-side receiver circuit illustrated in FIG. 4A.

FIG. 4A shows a schematic block diagram of a high-side receiver circuit according to one or more embodiments. FIG. 4B shows a truth table corresponding to the high-side receiver circuit illustrated in FIG. 4A. In particular, the high-side receiver circuit is implemented in the high-side receiver 12 shown in FIG. 2 and receives a differential transmission comprising a differential pair of signals corresponding to an input signal Bitx (i.e., an information bit) from the low-side transmitter 22 via the termination diodes 31.

The high-side receiver circuit includes a Schmitt trigger 41a, a Schmitt trigger 41b, a pull down resistor Ra-down, a pull down resistor Rb-down, an event sensor 42 (i.e., a dV/dt and NegVs event sensor), an XOR gate 43, a three port AND gate 44, a three port AND gate 45, a 0 to 1 delay gate 46, a 0 to 1 delay gate 47, and a set-reset (SR) flip-flop 48.

On the low-side, differential signaling is used to transmit each information bit through the termination region 30. In particular, the low-side transmitter circuit of the low-side transmitter 22 includes two buffers 22a and 22b configured to output the differential pair of signals as complementary bits Bitx and Bitx! of a the input signal. Buffer 22b may be an inverter which inverts bit Bitx into its complementary bit Bitx!. Said differently, the low-side transmitter circuit is configured to receive the input signal Bitx from the microcontroller 5b or from a memory (internal or external to the gate driver 5a) and convert it into two complementary signals. The complementary signals are a differential pair of signals used to send the transmission bit. Both buffers 22a and 22b may also serve as amplifiers.

The topology and the logic of the high-side receiver circuit 12 are designed with the aim of discriminating true transmissions from false transmissions. The abrupt switching action of voltage Vs between the high and low voltage domains makes a gate driver a harsh environment to operate a reliable bit transfer. Data may be corrupted due to parasitic currents and voltage drops. Whenever the high-side voltage domain aligns to low-side voltage domain (i.e., when the low power switch 3L is on) and there is no disturbance is affecting the transmission, it is possible to write the transmitted bits in an SR flip-flop.

During each PWM cycle, Vs is high for a portion of the PWM period and it switches low for the remaining portion of the PWM period. Since a transmission can only occur when Vs=DC− (e.g., Vs=Vss), the time when Vs is low (Vs=Vss) should be greater than a "0 to1 delay" (see e.g., elements 46 and 47) plus some other propagation delays (e.g., diode turn on delay, delay at the receiver input node N1, N2 due to parasitic resistance and capacitance, and Schmitt trigger and logic gate propagation delays) in order to successfully transmit information via the termination diodes. The "0 to 1 delay" provided by elements 46 and 47 are introduced to remove eventual spurious glitches that may appear at the output of the three-input AND gate described below. The "0 to 1 delay" time may be selected such that this delay time plus propagation delays meets the requirement above for allowing transmissions and at the same time filtering out of NegVs events and ringing in the very first part of a low phase. However, there is a trade-off between transmitting at every PWM cycle and false transmission rejection.

An input signal Bitx represents the information bit to be written in an output buffer of the high-side receiver 12. The low-side transmitter 22 transmits two complementary (i.e., differential) bits Bitx and Bitx! as a differential transmission. These two bits must be complementary values of each other and are used to help discriminate true transmissions from false transmissions. For example, if the two bits are identical, the receiver circuit 12 can determine that the transmission is a false transmission and does not update its output buffer. Thus, two termination diodes 31a and 31b are used to transmit a single information bit (i.e., two termination diodes 31 are used for each information bit) and another termination diode 31s is used by the event sensor 42 to detect negative dV/dt events and/or NegVs events.

The receiver circuit 12 shown in FIG. 4A shows a configuration for transmitting a single transmission bit (e.g., Bitx) using a differential receiver branch comprising signal paths A and B. According to this arrangement, if three information bits (e.g., Bitx, Bity, and Bitz) were being transmitted by the low-side, additional differential receiver branches would be added, each with its own SR flip-flop. Each differential receiver branch may share and thus be coupled to the output of the event sensor 42 in a similar manner. Here, the event sensor signal path S may be coupled to each AND gate of each differential receiver branch. Thus, seven termination diodes 31 would be used for a three bit transmission, including three pairs for transmitting the information bits and one for the event sensor 42.

As noted above, the two bits Bitx and Bitx! must be complementary values of each other for a valid transmission. The receiver circuit 12 reads the differential digital voltage signals and stores one bit as Bithox in a high-side output buffer. In addition, the output of the event sensor 42 is high (i.e., S=1) when writing to the SR flip-flop 48 is allowed. That is, writing is allowed when there is no negative dV/dt or NegVs event. The output of the event sensor 42 may be referred to as an event signal S which indicates whether a write (valid) event is present, during which writing is enabled, or an invalid event is present, during which writing is disabled. A negative dV/dt event and a NegVs event are referred to as invalid events.

The truth table shown in FIG. 4B sets forth one column for each variable at various stages of the receiver circuit, with valid bits at Bithox being indicated as a 0 or a 1, and invalid bits being indicated as a "*". An invalid bit may be result of either the voltage domains not being aligned (e.g., when the high-side switch 3H is on) or due to an error detected by the event sensor 42. When an invalid bit occurs, the SR flip-flop 48 is not written to and the output buffer is not updated or refreshed.

An input voltage at a Schmitt trigger that exceeds the upper threshold causes the Schmitt trigger to change its output a logic 1, whereas an input voltage that is below the lower threshold causes the Schmitt trigger to change its output to a logic 0.

Going back to the function of the pull-down resistors Ra-down and Rb-down, each resistor ties the receiver input at the receiver node to Vs in the high-side when the termination diode 31a or 31b is off. For example, the receiver input may be tied to 1200V when the high-side switch 3H is on.

When the voltage domains are aligned, the low-side switch 3L is on and Vs is substantially equal to Vss (i.e., 0V). Under this condition, Vb is also roughly equal to Vcc. Only in this condition can the termination diodes be intentionally selectively turned on: diode 31a on and diode 31b off, or vice versa. In all other conditions, the diodes are always all on or all off at the same time.

Both dV/dt and negVs are "common mode events." While they should not generate false differential transmissions, diodes and receivers are not identical and there can be a mismatch. Due to the mismatch, both dV/dt and negVs in certain marginal circumstances can force a current sufficient to turn on the receiver in only one of the diodes (e.g., of a differential pair) and generate a wrong transmission. The sensor used to blank the transmission is similar to the receiver (i.e., resistor Ra-down and Schmitt trigger 41a), but intentionally more sensitive to overcome any possible mismatch.

Turning back to the condition under which the voltage domains are aligned, the voltage at the receiver node rises above the upper threshold of the Schmitt trigger when the diode is on. This occurs only when Vs=Vss=0V and the transmitter 22 in the low-side is transmitting a logic 1 (Vforward=(Vcc−Vs)>Von=1V). In other words, a termination diode can only be forward biased when the output of buffer 22a or 22b is 1. When the output of buffer 22a or 22b is 0, the termination diode remains reverse biased and is turned off.

Since Vcc is equal to 15V and Vs is equal to 0V when the low-side switch 3L is on, the termination diode is able to transmit when its input is logic 1. Thus, when Vs is equal to 0V, the termination diode 31a is able to transmit when input bit Bitx is 1 and the termination diode 31b is able to transmit when the input bit Bitx is 0 (i.e., when Bitx! is 1).

During a low-side to high-side transmission, current flows from the low-side to the high-side through the termination diodes 31a or 31b. This current sinks current from the low-side, through the termination diode, through the pull-down resistor, to Vs. The voltage drop (ΔV) across the pull-down resistor imposed by the sinking current is such that the voltage at the receiver node remains greater than the upper Schmitt trigger threshold. For example, the voltage at the receiver node may be configured to exceed the upper Schmitt trigger threshold when the termination diode is on. Upon detecting this voltage that exceeds its upper threshold, the Schmitt trigger may output a logic 1.

When termination diode is off (i.e., when the high-side power transistor 3H is on), the voltage at the receiver node is equal to Vs (e.g., 1200V), which is greater than the voltage at the anode, regardless of the input bit Bitx. For example, the voltage at the anode can be at most 15V when the output of buffer 22a or 22b is 1. Thus, there is a strong reverse bias across the termination diodes and the channel of communication through the termination diode is completely interrupted under these circumstances.

Since bits Bitx and Bitx! are complementary, one of the termination diodes 31a and 31b will be forward biased while the other will be reverse biased. It is to be noted that the diode series resistance (e.g., about 10 KOhm) limits the minimum values of the pull-down resistors (and the pull-up resistors in other embodiments). This may put constraints on the minimum transmission time due to a delay in switching a termination diode on and off.

In contrast, when the voltage domains are not aligned, the high-side switch 3H is on, Vs remains high, and both termination diodes 31a and 31b are reverse biased as result. In this case, the transmission of information bits is blocked.

Figure 4C:
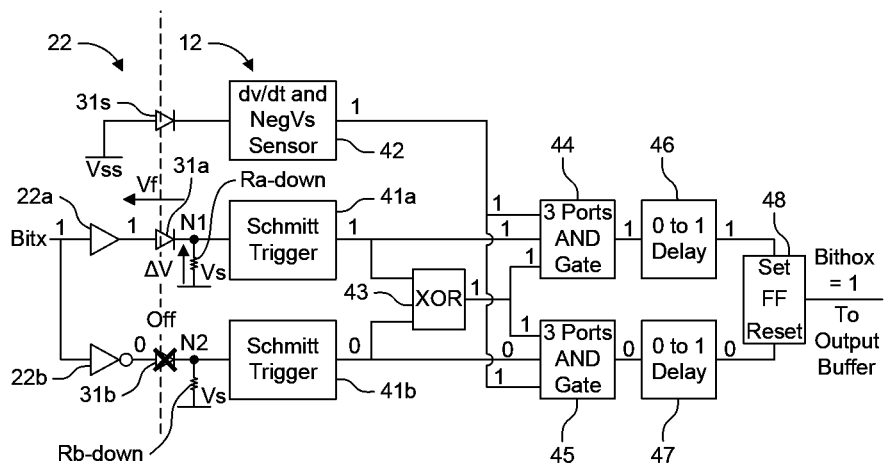
FIG. 4C shows a schematic block diagram of the high-side receiver circuit illustrated in FIG. 4A where Bitx is 1.
Figure 4D:
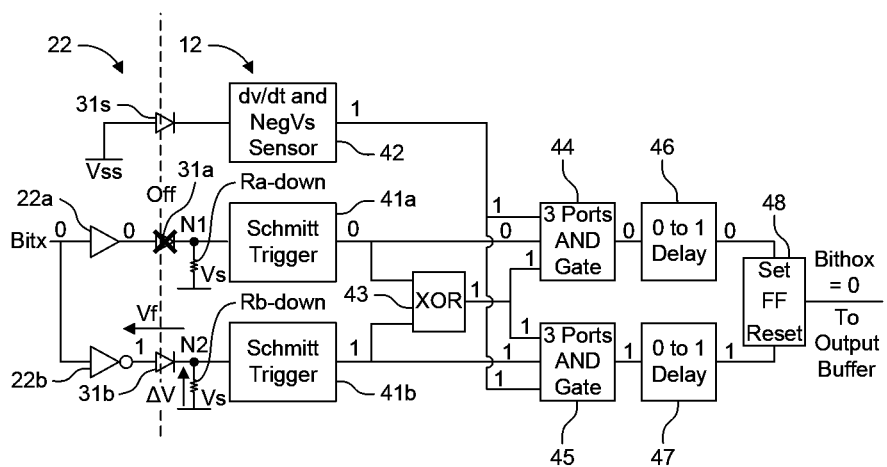
FIG. 4D shows a schematic block diagram of the high-side receiver circuit illustrated in FIG. 4A where Bitx is 0.

FIG. 4C shows a schematic block diagram of the high-side receiver circuit illustrated in FIG. 4A where Bitx=1. In contrast, FIG. 4D shows a schematic block diagram of the high-side receiver circuit illustrated in FIG. 4A where Bitx=0. As can be seen, when Bitx=1, the termination diode 31a is forward biased (i.e., on) and the termination diode 31b is reverse biased (i.e., off).

The Schmitt triggers 41a and 41b are configured to forward its input bit to its output. Thus, a logic high "1" bit received at its input is output as a logic high "1" bit, and a logic low "0" bit received at its input is output as a logic low "0" bit.

The XOR gate 43 is configured to ensure that the bits output from the Schmitt triggers 41a and 41b are complimentary. This is to ensure that voltage Vs is low, indicating that the voltage domains are aligned and that no interference or other error is present that may produce a false transmission. For example, when voltage Vs is high, the outputs of both Schmitt triggers 41a and 41b are logic 0, indicating that the voltage domains are not aligned. Writing to the SR flip-flop 48 is only enabled when the output of the XOR gate 43 is a logic 1. Thus, writing of the SR flip-flop 48 is prevented by the XOR gate 43 when voltage Vs is high.

The AND gates 44 and 45 are each configured to receive three inputs: one from the event sensor 42, one from the XOR gate 43, and one from its corresponding Schmitt trigger 41a or 41b. The output of the event sensor 42 is high with the exception of an occurrence of a negative dV/dt event or a NegVs event. Thus, the output of the event sensor 42 is high (i.e., S=1) when writing to the SR flip-flop 48 is allowed and low (i.e., S=0) when writing to the SR flip-flop 48 is disabled. In addition, as noted above, writing to the SR flip-flop 48 is enabled only when the output of the XOR gate 43 is a logic 1.

In the case that the output of the event sensor 42 and the XOR gate 43 are both high, the SR flip-flop 48 will be either set or reset depending on the bit value of Bitx. When Bitx=1, AND gate 44 will output a logic 1 and AND gate 45 will output a logic 0. In this case, the set input of the SR flip-flop 48 will be high (enabled) after a 0 to 1 delay by the delay gate 46. As a result, the output of the SR flip-flop 48 will either be set or refreshed to a logic 1 (i.e., Bithox=1). In this case, the reset input of the SR flip-flop 48 will be low and has no effect on writing to the output buffer.

The delay gate 46 introduces a "0 to 1 delay" to remove eventual spurious glitches that can appear at the output of the three-input AND gate 44. For example, when the inputs of the XOR gate 43 switch simultaneously (e.g. from 11 to 00), due to the topology of the XOR gate 43, it may happen that a positive glitch appears such that the XOR gate 43 outputs 1 instead of a 0 for a short time during the inputs transition. The "0 to 1 delay" is set to be longer in duration than the time it takes the output of the XOR gate 43 to settle. In this way, any change in the output of the three-input AND gate 44 that is less than the "0 to 1 delay" is ignored and filtered out, and thus can be used to filter out the spurious glitches that may occur during an inputs transition at the XOR gate 43. Without filtering these spurious glitches, the glitches may propagate to the SR flip-flop 48 and cause an incorrect bit to be stored at Bithox Conversely, when Bitx=0, AND gate 44 will output a logic 0 and AND gate 45 will output a logic 1. In this case, the reset input of the SR flip-flop 48 will be high (enabled) after a 0 to 1 delay by the delay gate 47. As a result, the output of the SR flip-flop 48 will either be set or refreshed to a logic 0 (i.e., Bithox=0). In this case, the set input of the SR flip-flop 48 will be low and has no effect on writing to the output buffer.

In a similar manner to the delay gate 46, the delay gate 47 introduces a "0 to 1 delay" to remove eventual spurious glitches that can appear at the output of the three-input AND gate 45. For example, when the inputs of the XOR gate 43 switch simultaneously (e.g. from 11 to 00), due to the topology of the XOR gate, it may happen that a positive glitch appears such that the XOR gate 43 outputs 1 instead of a 0 for a short time during the inputs transition. The "0 to 1 delay" is set to be longer in duration than the time it takes the output of the XOR gate 43 to settle. In this way, any change in the output of the three-input AND gate 45 that is less than the "0 to 1 delay" is ignored and filtered out, and thus can be used to filter out the spurious glitches that may occur during an inputs transition at the XOR gate 43. Without filtering these spurious glitches, the glitches may propagate to the SR flip-flop 48 and cause an incorrect bit to be stored at Bithox.

The enable signal output by the AND gates 44 and 45 to either enable the set input or the reset input of the SR flip-flop 48 may also be referred to as a strobe signal.

In view of the above, the high-side receiving circuit 12 has the following features.

The high-side receiving circuit 12 reads differential digital voltage signals (square pulses) and stores one bit.

Errors may occur due to disturbance events such as significant parasitic currents rising from stray capacitance of the junctions and abrupt changes in high-side voltage level (I=C*dV/dt). Disturbance events include negative dV/dt events and NegVs events. During a negative dV/dt event, a parasitic current is induced by charging and discharging of the diode capacitance of the termination diodes 31 during descending Vs transitions. These "common mode" disturbance events may be detected to prevent false transmissions writing to the SR flip-flop 48.

Pull up/down loads and inverter threshold values should be carefully dimensioned to make transmissions possible despite the partition effect with the parasitic resistances of the termination diodes.

High dVs/dt currents and negative Vs produce spikes (voltage protection diodes for transistors connected to anode or cathode) and glitches on the receiver side. Differential transmission and symmetric paths minimize the possibility of errors due to common mode disturbances.

The dedicated sensor for detection of dVs/dt and NegVs events compensates for an offset introduced by mismatch in the differential branches (pull up/down resistors, termination diodes, temperature, etc.) which can generate a wrong transmission in the presence of small disturbances. The sensor inhibits transmission in presence of dV/dt and neg Vs.

Schmitt triggers give a clean output in the presence of noisy input.

A sensor node is defined herein as a input node to an event sensor on the receiver side. A receiver node is defined herein as an input node to receiving paths on the receiver side (i.e., the node of the high-side receiver coupled to the cathode of a termination diode, and the node of the low-side receiver coupled to the anode of a termination node). The sensing node is more sensitive than the receiver nodes due to having a higher impedance, allowing to interrupt false transmissions. In the event of a false transmission, the output state of the SR flip-flop 48 remains the same and last valid data at the output buffer is maintained. In particular, when the set and reset inputs of the SR flip-flop 48 are both set to logic 0, the output state of the SR flip-flop 48 remains the same as the last valid data stored at the output buffer.

Strong differential signals (desired bits) can cause a transition while common mode signals, such as dV/dt currents or Vs oscillations for instance, are not likely to cause false transmissions for either large or small disturbances. Any glitch that lasts less than the "0 to 1 delay" filtering time is removed by a "0 to 1 delay" in the strobe signal. Thus, whenever the high-side voltage domain aligns to low-side voltage domain and no common mode disturbance is affecting the transmission, it is possible to store the transmitted bit Bitx in the SR flip-flop 48 until next PWM cycle. According to this technique, bits can be safely refreshed or changed at a PWM cycle that has an off duration greater than the "0 to 1 delay". Furthermore, when voltage Vs is high, writing is prevented by the XOR 43 since both receiver nodes (i.e., the input nodes of the Schmitt triggers 41a and 41b) are both pulled down. In this case, when voltage Vs is high, the last valid bit at the output buffer is maintained until next alignment in voltage domains.

Figure 5A:
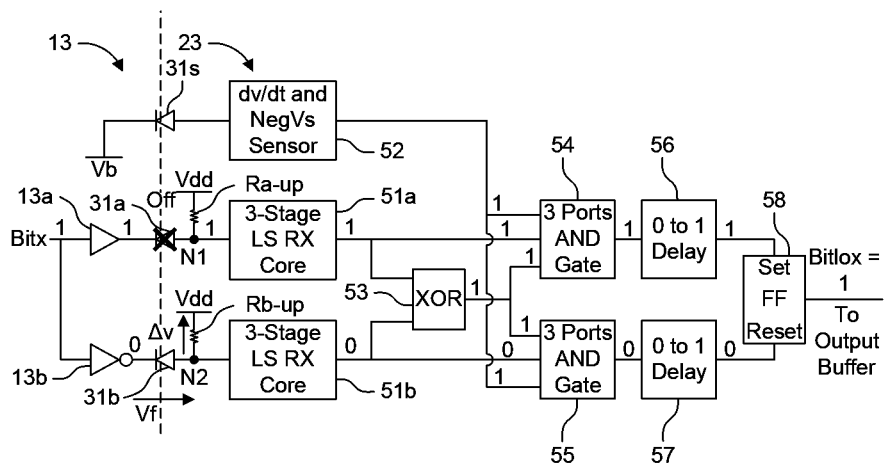
FIG. 5A shows a schematic block diagram of a low-side receiver circuit in the case that a differential input signal is equal to 1 according to one or more embodiments.
Figure 5B:
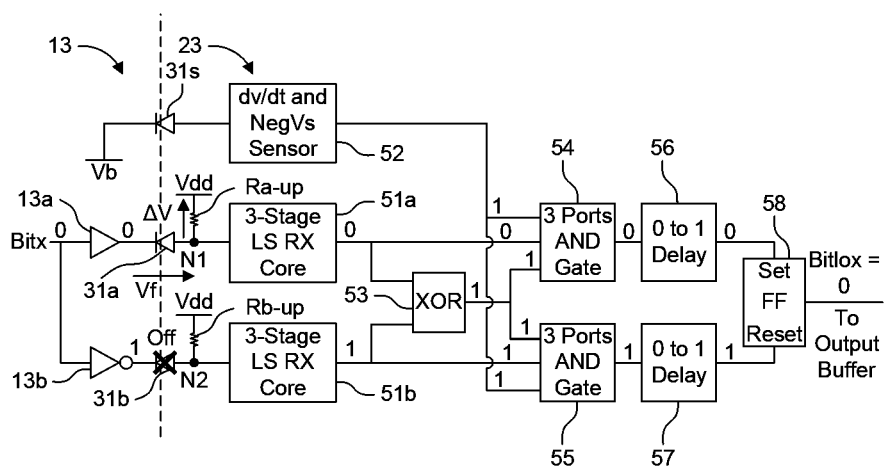
FIG. 5B shows a schematic block diagram of the low-side receiver circuit in the case that the differential input signal is equal to 0 according to one or more embodiments.

FIG. 5A shows a schematic block diagram of a low-side receiver circuit in the case that a differential input signal is equal to 1 according to one or more embodiments. Conversely, FIG. 5B shows a schematic block diagram of the low-side receiver circuit in the case that the differential input signal is equal to 0 according to one or more embodiments. In particular, the low-side receiver circuit is implemented in the low-side receiver 23 shown in FIG. 2 and receives a differential transmission comprising a differential pair of signals corresponding to an input signal Bitx (i.e., an information bit) from the high-side transmitter 13 via the termination diodes 31.

The low-side receiver circuit includes a 3-stage low-side receiver core 51a, a 3-stage low-side receiver core 51b, a pull up resistor Ra-up, a pull up resistor Rb-up, an event sensor 52 (i.e., a dV/dt and NegVs event sensor), an XOR gate 53, a three port AND gate 54, a three port AND gate 55, a 0 to 1 delay gate 56, a 0 to 1 delay gate 57, and an SR flip-flop 58. The 3-stage low-side receiver core 51a behaves similar to a Schmitt trigger in that it is configured with an upper threshold and a lower threshold, and generates a logic high or logic low output based on the voltage at the receiver node in comparison to the threshold levels.

On the high-side, differential signaling is used to transmit each information bit through the termination region 30. In particular, the high-side transmitter circuit of the high-side transmitter 13 includes two buffers 13a and 13b configured to output a differential version of the input signal (Bitx) as Bitx itself and its complementary bit, Bitx!. Buffer 13b may be an inverter which inverts bit Bitx into its complementary bit Bitx!. Said differently, the high-side transmitter circuit is configured to receive the input signal Bitx from the diagnostics block 15 and convert it into two complementary bits. This encoding (conversion to differential bits) allows for false transmission detection and rejection. Both buffers 22a and 22b may also serve as amplifiers.

Similar to the high-side receiver circuit illustrated in FIG. 4A, the topology and the logic of the low-side receiver circuit 23 are designed with the aim of discriminating true transmissions from false transmissions. The abrupt switching action of voltage Vs between the high and low voltage domains makes a gate driver a harsh environment to operate a reliable bit transfer. Data may be corrupted due to parasitic currents and voltage drops. Whenever the high-side voltage domain aligns to low-side voltage domain (i.e., when the low power switch 3L is on) and there is no disturbance is affecting the transmission, it is possible to write the transmitted bits in an SR flip-flop.

The XOR gate 53, the three port AND gate 54, the three port AND gate 55, the 0 to 1 delay gate 56, the 0 to 1 delay gate 57, and the SR flip-flop 58 operate substantially similar to their counterparts described in conjunction with FIGS. 4A-4D. In the case of FIGS. 5A and 5B, the SR flip-flop 58 outputs an output bit Bitlox to a low-side output buffer according to the input bit Bitx as long as writing is enabled.

While the termination diode 31s is reversed biased during a negative dV/dt event, current may flow into it anyways due to voltage variation across its parasitic capacitance. In addition, negVs events are caused due to high forward bias currents having same direction as a negative dv/dt current. Thus, the output of the event sensor 52 is high (i.e., S=1) when writing to the SR flip-flop 58 is allowed and low (i.e., S=0) when writing to the SR flip-flop 58 is disabled. In addition, writing to the SR flip-flop 58 is enabled only when the output of the XOR gate 53 is a logic 1, which indicates that the voltage domains are aligned.

An input voltage at a 3-stage low-side receiver core that exceeds the upper threshold causes the 3-stage low-side receiver core to change its output a logic 1, whereas an input voltage that is below the lower threshold causes the 3-stage low-side receiver core to change its output to a logic 0.

During a positive dV/dt event, the parasitic current in the termination diodes 31 goes in the opposite direction compared to the transmission when a diode is ON, so writing is disable because the receivers are both giving a 0 output (i.e., the inputs to the XOR are both 0).

Going back to the function of the pull-up resistors Ra-up and Rb-up, each resistor ties the receiver input at the receiver node to Vdd in the low-side when the termination diode 31a or 31b is off. For example, Vdd may be an internally generated regulated voltage of 5.5V and the receiver input may be tied to 5.5V when the high-side switch 3H is on.

When the voltage domains are aligned, the low-side switch 3L is on and Vs is substantially equal to Vss (i.e., 0V). The voltage at the receiver node falls below the lower threshold of the 3-stage low-side receiver core when the diode is on. This occurs only when Vs=Vss=0V and the transmitter 13 in the high-side is transmitting a logic 0 (Vforward=(Vdd−Vs)>Von=1V). In other words, a termination diode can only be forward biased when the output of buffer 13a or 13b is 0. Thus, when Vs is equal to 0V, the termination diode 31a is able to transmit when input bit Bitx is 0 and the termination diode 31b is able to transmit when the input bit Bitx is 1 (i.e., when Bitx! is 0). When the output of buffer 13a or 13b is 1, the termination diode remains reverse biased and is turned off.

During a high-side to low-side transmission, current flows from the low-side to the high-side through the termination diodes 31a or 31b. This current sinks current from the low-side, from Vdd, though the pull-up resistor, and through the termination diode to the high-side. Due to the voltage drop (ΔV) across the pull-up resistor imposed by the sinking current, the voltage at the receiver node is at a voltage level greater than 0V but less than the lower threshold voltage of the 3-stage low-side receiver core. For example, the lower threshold voltage may be 3V, which may be the half-scale voltage. When termination diode is off, the voltage at the receiver node is equal to Vdd.

The supply voltages to the high-side amplifiers/buffers 13a and 13b are Vb and Vs. Thus, a logic high output (i.e., logic 1) from the amplifiers/buffers is equal to Vb (i.e., Vs plus Vcc), while a logic low output (i.e., logic 0) from the amplifiers/buffers is equal to Vs.

When the voltage domains are not aligned, Vs is equal to the maximum high-side voltage (e.g., 1200V), and the output of the high-side amplifiers/buffers are either equal to Vb (e.g., 1215V, where Vcc=15V) when outputting a logic 1 or equal to Vs (e.g., 1200V) when outputting a logic 0. In either case, a strong reverse bias exists across the termination diode since a local power supply, such as Vcc or Vdd, is only equal to, for example, 5.5V, and the termination diode is off. The channel of communication through the termination diode is completely interrupted under these circumstances. In addition, since the receiver node is tied to Vdd (e.g., 5.5V) by the pull-up resistor when the diode is off, the voltage at the receiver node is perceived at a logic high level by the 3-stage low-side receiver core. The 3-stage low-side receiver core in turn outputs a logic high value.

On the other hand, when the voltage domains are aligned, Vs is equal to Vss (i.e., 0V). In this case, since Vb is equal to Vs plus 15V (i.e., 0V+15V), the output of the high-side amplifiers/buffers is either equal to Vb (e.g., 15V) when outputting a logic 1 or equal to Vs (e.g., 0V) when outputting a logic 0. In the case of buffer 13a or 13b outputting a logic 0 (i.e., 0V, when Vs is equal to 0V), the corresponding termination diode 31a or 31b is forward biased due to a higher voltage (i.e., Vdd−ΔV) being present at the receiver node (i.e., at the anode of the termination diode). Turning on the termination diode causes the voltage at the receiver node to fall below the lower threshold of the 3-stage low-side receiver core, and the 3-stage low-side receiver core outputs a logic 0.

Figure 6A:
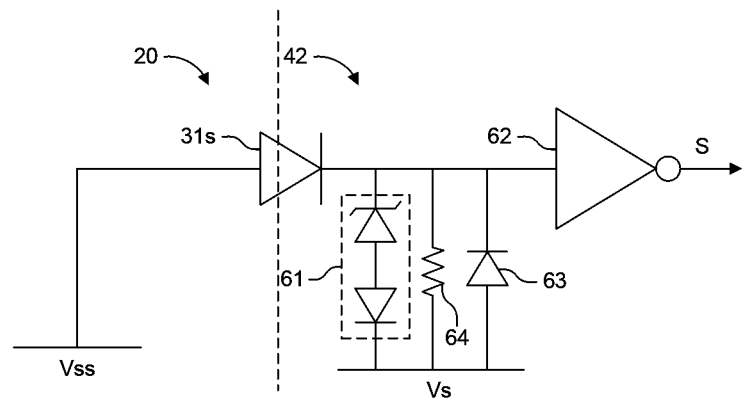
FIG. 6A shows a schematic circuit diagram of a high-side event sensor according to one or more embodiments.

FIG. 6A shows a schematic circuit diagram of a high-side event sensor according to one or more embodiments. In particular, the high-side event sensor is an example of the event sensor 42 shown in FIG. 4A with its input coupled to the cathode of the termination diode 31s and its output coupled to the AND gates 44 and 46. The event sensor 42 is configured to generate a signal S used to discriminate true transmissions from false transmissions, where S=1 indicates that writing to the SR flip-flop is enabled and S=0 indicates that writing is not allowed or disabled.

Figure 6B:
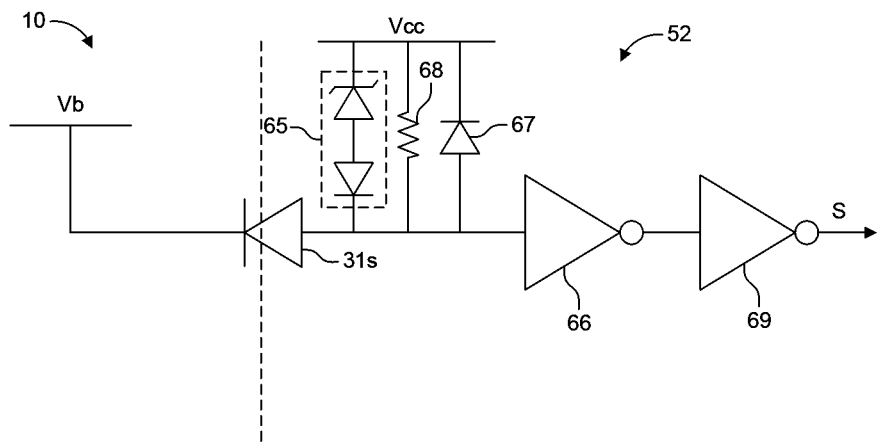
FIG. 6B shows a schematic circuit diagram of a low-side event sensor according to one or more embodiments.

FIG. 6B shows a schematic circuit diagram of a low-side event sensor according to one or more embodiments. In particular, the high-side event sensor is an example of the event sensor 52 shown in FIG. 5A with its input coupled to the anode of the termination diode 31s and its output coupled to the AND gates 54 and 56. The event sensor 52 is configured to generate an event signal S used to discriminate true transmissions from false transmissions, where S=1 indicates that writing to the SR flip-flop is enabled and S=0 indicates that writing is not allowed or disabled.

Figure 6C:
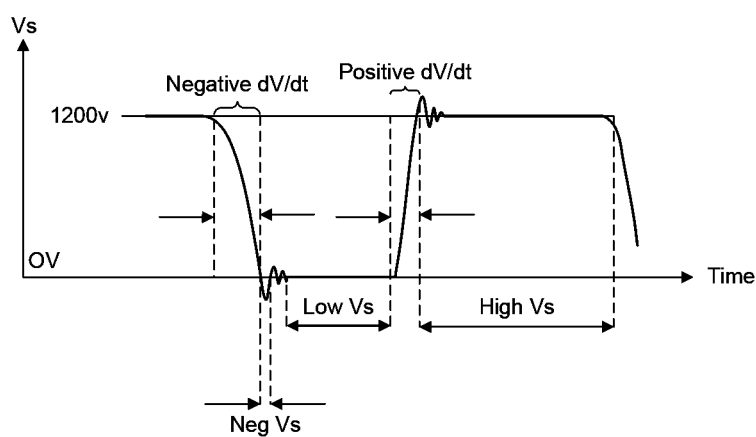
FIG. 6C shows a graph that plots voltage Vs over time during which different voltage events or phases occur according to one or more embodiments.

FIG. 6C shows a graph that plots voltage Vs over time (i.e., over one PWM cycle) during which different voltage events or phases occur according to one or more embodiments. In particular, the graph illustrates the occurrence of a negative dV/dt event during which writing is disabled by the event sensors 42 and 52, a NegVs event during which writing is disabled by the event sensors 42 and 52, a low Vs event during which the voltage domains are aligned and writing is enabled by the high-side and low-side receiver circuits, a positive dV/dt event during which writing is disabled by the XOR gates 43, 53 since its inputs are equal, and a high VS event during which the voltage domains are not aligned and writing is disabled by the XOR gates 43, 53 since its inputs are equal. As a result, the only period during which writing is enabled by the low-side and high-side receiving circuits is during the low Vs event.

Turning back to FIG. 6A, while the termination diode 31s is reversed biased during a negative dV/dt event, current may flow into it anyways due to voltage variation across its parasitic capacitance. In addition, negVs events are caused due to high forward bias currents having same direction as a negative dv/dt current. Event sensor 42 is configured to detect this current flow and change its output to a logic 0 in response thereto.

A Vs descending phase (i.e., a negative dV/dt event) and a NegVs event, cause a zener diode and diode arrangement 61 of the event sensor 42 to turn on which causes an output of an inverter 62 of the event sensor to switch from a logic 1 to a logic 0. A single diode 63 protects the inverter 62 from a positive dV/dt current. The inverter 62 is a CMOS inverter designed to have a strong pull down of the output (i.e. wide/short nmos) and a weak pull up (narrow/long pmos) in order to increase the sensitivity range and to pre-filter Vs oscillations in its low phase. In this way, the inverter 62 is fast in forcing its output S low so as to inhibit the transmission, and slow in pulling S high so as to permit transmission. For example, the inverter 62 may be designed to have its zero threshold to be lower than that of the zero threshold of the Schmitt triggers of the receiving nodes. The consequence of this is increased sensitivity and pre-filtering. A resistor 64 pulls down the sensing node (i.e., the input to the inverter 62) confirming a steady state condition (i.e., whether Vs is high or low).

A positive dV/dt, Vs ascending phase, is not crucial for event detection by the event sensor 42 since false transmissions are substantially avoided by receiver circuit topology and the gate driver is already set to the desired current capability in the previous phase (i.e., in the low Vs phase). Here, a common mode current is forced through the pull-down resistors Ra-down and Rb-down, pulling both receiver nodes at the high-side receiver 12 below Vs. Such signals are rejected before the XOR by the Schmitt trigger, since both the nodes N1 and N2 are moved below local ground, far from the Schmitt trigger threshold. and overwriting the SR flip-flop 48 is not possible. In other words, both Schmitt triggers will output 0, since their inputs move away from the positive threshold of the Schmitt trigger. Then, of course, the output of the XOR will be 0 and will make overwriting of the flip-flop impossible.

Turning to FIG. 6B, during neg dV/dt, the diode 31s is reverse biased, but current may flow in diode 31s due to a discharge of termination diode parasitic capacitance, triggering the event sensor as in the case of neg VS, with the exception that neg dV/dt current is originated from parasitic capacitance discharge and Neg Vs current is originated from forward biased diodes. On positive dV/dt, the diode 31s pulls the inverter 66 input node above Vcc (clamped by protection diode 67) and nothing happens at the event sensor output. Thus, no current flows through the termination diode unless it is a dV/dt current or a large direct bias current peak, typically associated with a NegVs event.

A Vs descending phase (i.e., a negative dV/dt event) and a NegVs event, cause a zener and a diode arrangement 65 of the event sensor 52 to turn on which causes an output of an inverter 66 of the event sensor 52 to switch from a logic 0 to a logic 1. Another inverter 69 is used to invert the output of inverter 66 in order to convert event signal S into an error flag (S=0) such that the rest of the logic (e.g., the AND gates 54 and 55) of the receiver circuit 23 can recognize and process the error flag appropriately. A single diode 67 protects the inverter 66 from a positive dV/dt current. The inverter 66 is a CMOS inverter designed to have a strong pull up of the output (i.e. wide/short pmos) and a weak pull down (narrow/long nmos) in order to increase the sensitivity range and to pre-filter Vs oscillations in its low phase. In this way, the inverter 66 is fast in forcing its output S low so as to inhibit the transmission, and slow in pulling S high so as to permit transmission. For example, the inverter 66 may be designed to have its zero threshold to be lower than that of the zero threshold of the Schmitt triggers of the receiving nodes. The consequence of this is increased sensitivity and pre-filtering. A resistor 68 pulls up the sensing node (i.e., the input to the inverter 66) confirming a steady state condition (i.e., whether Vs is high or low).

A positive dV/dt, Vs ascending phase, is not crucial for event detection by the event sensor 52 since false transmissions are substantially avoided by receiver circuit topology and the gate driver is already set to the desired current capability in the previous phase (i.e., in the low Vs phase). Here, a common mode current is forced through the pull-up resistors Ra-up and Rb-up, pulling both receiver nodes at the low-side receiver 23 above Vcc (i.e., clamped one diode drop above Vcc by protection diode 67). Such signals are rejected by the XOR gate since its inputs are the same and, as a result, overwriting the SR flip-flop 58 is not possible.

For example, during an occurrence of a positive dV/dt event, both receiver nodes of the low-side receiver 23 are pulled higher than Vcc, but the 3-stage receiver core is sensitive only when the input nodes N1 and N2 are pulled down, compared to Vcc. Thus, the output of the XOR gate 53 is logic 0, causing the outputs of both AND gates 54 and 55 to be a logic 0, and preventing writing to or refreshing the SR flip-flop 58.

A false transmission due to mismatch may occur for some small interval of values of dVs/dt. Being more sensitive to currents, the event sensors 42 and 52 are configured to interrupt any transmission as being a false transmission.

In view of the above, the use of small HV termination isolated diodes as a whole may be used to transmit bits, bidirectionally, between the high-side region 10 and the low-side region 20 when the voltage domains are aligned (Vs=~Vss and Vb=~Vcc), with each diode responsible for transmitting in a specific uplink or downlink direction. This reduces silicon area and the amount of power dissipation compared with existing bit transfer solutions at the cost of small delay. Such an arrangement also has an advantage of being implemented in an internal circuit of a gate driver inside a power module.

High voltage gate drivers are typically designed to have one single output current level used to drive external power switches. The selection of the right output current level is not straightforward and it forces to have multiple iterations in the gate driver design development. Having the possibility to change and reconfigure the current level of a current pulse (control signal) dynamically in a single gate driver design leads to a one-system fits all approach having more flexibility and leading to an improved time to market.

For example, if the gate current is too low, the delays and the power dissipation into the power switches are increased, both of which have negative consequences. On the other side, having too much current makes the power switches fast and introduces electromagnetic interference that disturb the nearby electronics circuits and can prevent to meet certain standards. Thus, using the concepts described herein, a multi-bit configuration message (e.g., a 3-bit message) can be sent from the low-side to the high-side to configure the output current of the high side driver itself as is decided by the microcontroller 5*b*.

Since this is a case of parallel transmission, all the bits composing the multi-bit configuration message are transmitted simultaneously. Each one of them is fed to a dedicated pair of termination diodes and dedicated differential receiver, after being converted into its differential version (input bit Bitx is converted into a bit pair composed of Bitx itself and its complementary bit Bitx!). An SR flip-flop 48 (FIG. 4A) at the end of each differential receiver stores a single bit version equal to Bitx.

In addition, the same bits are used also to configure the output current of the low side driver, but this is straightforward since the microcontroller 5*b* is directly interfaced with the low side and no HV communication is needed.

In the same gate driver IC 5*a*, it is also possible to use communication in the opposite direction from the high-side to the low-side for desaturation diagnostic and detection of other anomalous events. Desaturation is a very high intensity overcurrent in a power switch such as when a low ohmic short happens and current reaches ten times (as an example) the max load current. If a desaturation event has happened in the high-side, a single warning bit may be transmitted from the high-side to the low-side and then ultimately to the microcontroller 5*b*.

While various embodiments have been described, it will be apparent to those of ordinary skill in the art that many more embodiments and implementations are possible within the scope of the disclosure. For example, while embodiments are described in the context of a monolithic gate driver IC having two voltage domains, the concepts are also applicable to other monolithic integrated circuits, having two voltage domains (HV and LV) separated by a termination region, in which communication of information between domains is beneficial. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

Depending on certain implementation requirements, embodiments provided herein can be implemented in hardware or in software. The implementation can be performed using a digital storage medium, for example a floppy disk, a DVD, a Blue-Ray, a CD, a RAM, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein refers to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements.

Thus, the techniques described in this disclosure may be implemented, at least in part, in hardware, software, firmware, or any combination thereof. For example, various aspects of the described techniques may be implemented within one or more processors, including one or more microprocessors, DSPs, ASICs, or any other equivalent integrated or discrete logic circuitry, as well as any combinations of such components.

A control unit including hardware may also perform one or more of the techniques described in this disclosure. Such hardware, software, and firmware may be implemented within the same device or within separate devices to support the various techniques described in this disclosure. Software may be stored on a non-transitory computer-readable medium such that the non-transitory computer readable medium includes a program code or a program algorithm stored thereon which, when executed, causes a computer program to perform the steps of a method.

Although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A gate driver, comprising:
a high-side region that operates in a first voltage domain;
a low-side region that operations in a second voltage domain lower than the first voltage domain;
a termination region interposed between the high-side region and the low-side region and configured to isolate the first voltage domain from the second voltage domain;
a high-side gate driver disposed in the high-side region and configured to drive a high-side power transistor;
a low-side gate driver disposed in the low-side region and configured to drive a low-side power transistor; and
a plurality of termination diodes disposed in the termination region and configured to transmit information bits between the high-side region and the low-side region, wherein each of the plurality of termination diodes includes an anode coupled to the low-side region and a cathode coupled to the high-side region.

2. The gate driver of claim 1, wherein:
the plurality of termination diodes are configured to transmit information bits between the high-side region and the low-side region when the first voltage domain and the second voltage domain are aligned, and
the plurality of termination diodes are configured to interrupt a transmission of the information bits between the high-side region and the low-side region when the first voltage domain and the second voltage domain are not aligned.

3. The gate driver of claim 2, wherein:
the first voltage domain and the second voltage domain are aligned while the low-side power transistor is turned on, and
the first voltage domain and the second voltage domain are not aligned while the high-side power transistor is turned on.

4. The gate driver of claim 1, wherein:
a first pair of termination diodes of the plurality of termination diodes are configured to transmit a first information bit from the low-side region to the high-side region via differential signaling, and
a second pair of termination diodes of the plurality of termination diodes are configured to transmit a second information bit from the high-side region to the low-side region via differential signaling.

5. The gate driver of claim 4, wherein the first information bit includes current pulse information, and the high-side gate driver is configured to receive the first information bit and set a current level of a current pulse used to drive the high-side power transistor based on the current pulse information.

6. The gate driver of claim 4, wherein the second information bit includes diagnostic information corresponding to an inverter leg to which the high-side power transistor and the low-side power transistor are coupled.

7. The gate driver of claim 6, wherein the diagnostic information indicates an overcurrent condition at the inverter leg.

8. The gate driver of claim 4, wherein the low-side region is coupled to a microcontroller, and the low-side region is configured to receive the first information bit from the microcontroller and to transmit the second information bit to the microcontroller.

9. The gate driver of claim 8, wherein the low-side region is configured to receive at least one control signal from the microcontroller in response to transmitting the second information bit to the microcontroller, the at least one control signal configured to control the high-side gate driver and the low-side gate driver.

10. The gate driver of claim 1, further comprising:
a first disturbance detection diode disposed in the termination region configured to permit a first event detection current to flow from the low-side region to the high-side region during at least one disturbance event and block the first event detection current from flowing from the low-side region to the high-side region in an absence of the at least one disturbance event;
a first event sensor disposed in the high-side region and configured to detect the first event detection current and interrupt a transmission to the high-side region received through at least one of the plurality of termination diodes in response to detecting the first event detection current;
a second disturbance detection diode disposed in the termination region configured to permit a second event detection current to flow from the low-side region to the high-side region during the at least one disturbance event and block the second event detection current from flowing from the low-side region to the high-side region in the absence of the at least one disturbance event; and
a second event sensor disposed in the low-side region and configured to detect the second event detection current and interrupt a transmission to the low-side region received through at least another one of the plurality of termination diodes in response to detecting the second event detection current.

11. The gate driver of claim 10, wherein the at least one disturbance event includes at least one of a negative Vs event and a descending dVs/dt event, where Vs is a high-side ground voltage.

12. The gate driver of claim 1, further comprising:
a low-side transmitter disposed in the low-side region configured to transmit at least one uplink information bit;
a high-side receiver disposed in the high-side region configured to receive the at least one uplink information bit from the low-side transmitter;
a high-side transmitter disposed in the high-side region configured to transmit at least one downlink information bit; and
a low-side receiver disposed in the low-side region configured to receive the at least one downlink information bit from the high-side transmitter.

13. The gate driver of claim 12, wherein:
the high-side receiver includes a first set-reset (SR) flip flop configured to store an uplink information bit of the at least one uplink information bit, and
the low-side receiver includes a second SR flip flop configured to store a downlink uplink information bit of the at least one downlink information bit.

14. The gate driver of claim 13, wherein:
the high-side receiver is configured to receive the uplink information bit via differential signaling comprising two uplink signals and store the uplink information bit at the first SR flip flop on a condition that the two uplink signals are complementary values of each other and disregard the uplink information bit on a condition that the two uplink signals are not complementary values of each other, and
the low-side receiver is configured to receive the downlink information bit via differential signaling comprising two downlink signals and store the downlink information bit at the second SR flip flop on a condition that the two downlink signals are complementary values of each other and disregard the downlink information bit on a condition that the two downlink signals are not complementary values of each other.

15. The gate driver of claim 13, wherein:
the high-side receiver includes a first event sensor, the first event sensor configured to detect at least one disturbance event and interrupt storing the uplink information bit at the first SR flip flop in response to detecting the at least one disturbance event, and
the low-side receiver includes a second event sensor, the second event sensor configured to detect the at least one disturbance event and interrupt storing the downlink information bit at the second SR flip flop in response to detecting the at least one disturbance event.

16. The gate driver of claim 12, wherein:
the high-side receiver includes a first event sensor, the first event sensor configured to detect at least one disturbance event and interrupt a transmission to the high-side region received through at least one of the plurality of termination diodes in response to detecting the at least one disturbance event, and
the low-side receiver includes a second event sensor, the second event sensor configured to detect the at least one disturbance event and interrupt a transmission to the low-side region received through at least another one of the plurality of termination diodes in response to detecting the at least one disturbance event.

17. A method of transmitting information bits across a termination region between a high-side region and a low-side region of a gate driver, the method comprising:
operating the high-side region in a first voltage domain;
operating the low-side region in a second voltage domain lower than the first voltage domain;
transmitting the information bits between the high-side region and the low-side region through a plurality of termination diodes disposed in the termination region, wherein each of the plurality of termination diodes includes an anode coupled to the low-side region and a cathode coupled to the high-side region,
transmitting the information bits between the high-side region and the low-side region through a plurality of termination diodes on a condition that the first voltage domain and the second voltage domain are aligned; and
interrupting a transmission of the information bits between the high-side region and the low-side region on a condition that the first voltage domain and the second voltage domain are not aligned.

18. The method of claim 17, further comprising:
transmitting a first information bit from the low-side region to the high-side region via differential signaling using a first pair of termination diodes of the plurality of termination diodes; and
transmitting a second information bit from the high-side region to the low-side region via differential signaling using a second pair of termination diodes of the plurality of termination diodes.

19. The method of claim 17, further comprising:
detecting at least one disturbance event; and
interrupting a transmission of the information bits between the high-side region and the low-side region in response to detecting the at least one disturbance event.

20. An integrated circuit, comprising:
a high-side region that operates in a first voltage domain;
a low-side region that operations in a second voltage domain lower than the first voltage domain;
a termination region interposed between the high-side region and the low-side region and configured to isolate the first voltage domain from the second voltage domain;
a high-side circuit disposed in the high-side region;
a low-side circuit disposed in the low-side region; and
a plurality of termination diodes disposed in the termination region and configured to transmit information bits between the high-side region and the low-side region, wherein each of the plurality of termination diodes includes an anode coupled to the low-side region and a cathode coupled to the high-side region,
wherein the plurality of termination diodes are configured to transmit information bits between the high-side region and the low-side region when the first voltage domain and the second voltage domain are aligned, and wherein the plurality of termination diodes are configured to interrupt a transmission of the information bits between the high-side region and the low-side region when the first voltage domain and the second voltage domain are not aligned.

21. The integrated circuit of claim 20, wherein:

a first pair of termination diodes of the plurality of termination diodes are configured to transmit a first information bit from the low-side region to the high-side region via differential signaling, and a second pair of termination diodes of the plurality of termination diodes are configured to transmit a second information bit from the high-side region to the low-side region via differential signaling.

22. The integrated circuit of claim 20, further comprising:

a first disturbance detection diode disposed in the termination region configured to permit a first event detection current to flow from the low-side region to the high-side region during at least one disturbance event and block the first event detection current from flowing from the low-side region to the high-side region in an absence of the at least one disturbance event;

a first event sensor disposed in the high-side region and configured to detect the first event detection current and interrupt a transmission to the high-side region received through at least one of the plurality of termination diodes in response to detecting the first event detection current;

a second disturbance detection diode disposed in the termination region configured to permit a second event detection current to flow from the low-side region to the high-side region during the at least one disturbance event and block the second event detection current from flowing from the low-side region to the high-side region in the absence of the at least one disturbance event; and a second event sensor disposed in the low-side region and configured to detect the second event detection current and interrupt a transmission to the low-side region received through at least another one of the plurality of termination diodes in response to detecting the second event detection current.

* * * * *